United States Patent
Victor et al.

[19]

[11] Patent Number: 6,127,094

[45] Date of Patent: Oct. 3, 2000

[54] ACRYLATE COPOLYMER-CONTAINING WATER-DEVELOPABLE PHOTOSENSITIVE RESINS AND PRINTING PLATES PREPARED THEREFROM

[75] Inventors: Mark W. Victor, Vista; Allyson R. Maurer, Escondido; Richard P. Homick, Santee, all of Calif.

[73] Assignee: Napp Systems Inc., San Marcos, Calif.

[21] Appl. No.: 08/943,725

[22] Filed: Oct. 2, 1997

[51] Int. Cl.[7] .............. G03F 7/033; G03F 7/18; G03F 7/32

[52] U.S. Cl. .............. 430/284.1; 430/283.1; 430/281.1; 430/287.1; 430/285.1; 430/306; 430/275.1; 430/935

[58] Field of Search .............. 430/283.1, 284.1, 430/287.1, 286.1, 281.1, 306, 275.1

[56] References Cited

U.S. PATENT DOCUMENTS

| | | | |
|---|---|---|---|
| 2,893,868 | 7/1959 | Barney | 96/115 |
| 4,275,142 | 6/1981 | Hosaka et al. | 430/271 |
| 4,323,673 | 4/1982 | Johnson et al. | 542/426 |
| 4,359,246 | 11/1982 | Ricketts | 299/2 |
| 4,622,088 | 11/1986 | Min | 156/244.11 |
| 4,726,877 | 2/1988 | Fryd et al. | 156/630 |
| 4,894,315 | 1/1990 | Feinberg et al. | 430/281 |
| 4,956,252 | 9/1990 | Fryd et al. | 430/138 |
| 5,073,477 | 12/1991 | Kusuda et al. | 430/287.1 |
| 5,075,192 | 12/1991 | Fryd et al. | 430/138 |
| 5,171,768 | 12/1992 | Prentice et al. | 523/348 |
| 5,230,987 | 7/1993 | Kawanami et al. | 430/284.1 |
| 5,238,783 | 4/1993 | Taniguchi et al. | 430/281 |
| 5,344,744 | 9/1994 | Ueda et al. | 430/287.1 |
| 5,348,844 | 9/1994 | Garmong | 430/286.1 |
| 5,369,166 | 11/1994 | Ozawa et al. | 524/560 |
| 5,460,920 | 10/1995 | Telser et al. | 430/309 |

FOREIGN PATENT DOCUMENTS

| | | | |
|---|---|---|---|
| 0 261 910 A2 | 3/1988 | European Pat. Off. | |
| 0 489 553 A1 | 6/1992 | European Pat. Off. | |
| 0 604 876 A2 | 7/1994 | European Pat. Off. | G01N 33/36 |
| 0 604 876 A3 | 7/1996 | European Pat. Off. | G01N 33/36 |
| WO 92/15628 WO | 9/1992 | WIPO | C08F 265/06 |
| 93/037423 | 2/1993 | WIPO | G03F 7/027 |

*Primary Examiner*—Cynthia Hamilton
*Attorney, Agent, or Firm*—Gray Cary Ware & Freidenrich; Stephen E. Reiter; Ramsey R. Stewart

[57] ABSTRACT

In accordance with the present invention, there are provided water-developable photopolymerizable compositions useful for the preparation of printing plates. Printing plates prepared employing invention compositions have excellent form stability, thereby enabling such plates to be handled without the need for excessive care. Once photopolymerized, printing plates of the invention have excellent physical properties, enabling their use in many very demanding applications, e.g., flexographic printing. Such applications require the photopolymerized resin to have excellent water resistance (so that exposure to water-based inks does not significantly alter resin properties), as well as high durability (so that the physical contacting associated with the printing process does not significantly degrade resin properties).

14 Claims, No Drawings

ACRYLATE COPOLYMER-CONTAINING WATER-DEVELOPABLE PHOTOSENSITIVE RESINS AND PRINTING PLATES PREPARED THEREFROM

FIELD OF THE INVENTION

The present invention relates to water-developable photosensitive printing plates and compositions useful for the preparation thereof.

BACKGROUND OF THE INVENTION

Photosensitive resins used for the manufacture of relief printing plates are preferably developable with water rather than organic solvent for various reasons such as ease of handling, health of workers who come in contact therewith, safety, and avoidance of environmental pollution. Printing plates employed for flexographic printing must be capable of printing on a variety of substrates, which vary widely in their composition and surface uniformity. Substrates employed for flexographic printing include metal foils, plastic films, kraft paper, corrugated board, laminated papers and boards, newsprint, and the like. In order to successfully print on this wide variety of substrates, one must use a variety of ink types and printing press conditions.

The ideal printing plate for use in flexographic printing applications would be one which is capable of withstanding the potentially deleterious effects of the agents which are likely to come in contact therewith, i.e., common ink solvents, developing media (e.g. water), radiation curable materials, and the like. The ideal printing plate will further show no tendency to crack when flexed, and will be soft enough to conform to irregular surfaces, yet durable enough to withstand the forces of the printing process. It is also desirable that the resin material employed for the preparation of printing plates resist cracking or degradation when exposed to ozone in ambient air.

Several types of photosensitive resin plates have been used for flexographic printing. For example, photosensitive resin plates prepared employing modified thermoplastic elastomeric rubber or rubber-like printing media have excellent mechanical properties. Unfortunately, however, such resin plates can be processed only in organic media (see, for example, U.S. Pat. Nos. 4,323,673, 4359,246 and 4,622,088).

More recently, solid flexographic printing plates which are developable in water have been described. See, for example, U.S. Pat. No. 4,956,252 (which describes the use of a core-shell microgel to produce a photosensitive resin). However, this patent requires that crosslinking of the core-shell microgel be specifically located inside the core, while the shell remains uncrosslinked. The patent also discusses the need for the existence of two glass transitions ($T_g$) in order to identify the core-shell nature of the microgel. In this patent, "microgel" is specifically noted to be used in a way other than in its conventional sense. Instead, the term is specifically defined as referring to a particle having two domains--a crosslinked core and an aqueous processable non-crosslinked shell. The core is explicitly stated to have less than 10% crosslinking and the shell is explicitly described as consisting of an acid-modified copolymer.

U.S. Pat. No. 4,726,877 also discloses the use of a core-shell microgel, but requires greater than 10% crosslinking in the material and a single $T_g$ of greater than 25° C. This patent also requires that an additional polymer binder be used in the preparation of the microgel.

European Patent Application No. 0 604 876 A1 also describes the use of a core-shell microgel, with monomeric dienes required for use in the core thereof. This publication does not require the use of a crosslinking agent for the preparation of the core-shell microgel. The resulting material is particularly susceptible to ozone degradation.

U.S. Pat. No. 5,075,192 is another recent patent which requires a core-shell microgel. This patent, however, specifically requires the use of allyl methacrylate as a crosslinking agent to provide grafting between the core and shell.

U.S. Pat. No. 4,894,315 describes a core-shell microgel blended with a linear copolymer composed of elastomeric and thermoplastic domains. In this patent, a crosslinked elastomeric core and a non-crosslinked thermoplastic shell is specifically required.

U.S. Pat. Nos. 2,893,868, 4,275,142 and Japanese Kokai Publication 61-22339 each disclose water developable photosensitive resins useful for flexographic printing. The compositions disclosed in the U.S. patents have poor water resistance, and the compositions disclosed in the Japanese Publication have poor mechanical properties after curing. All three of these documents require the use of a core-shell material that is a copolymer of at least four monomers, one of which is a monomeric diene. This copolymeric material is difficult to produce in a consistent manner and is particularly susceptible to ozone degradation.

U.S. Pat. Nos. 5,348,844 and 5,073,477 describe flexographic printing plates using a material which requires an additional copolymer to act as a binder for the resin plate. Both of these patents require a material that is a copolymer of four different monomers, one of which is a monomeric diene. This copolymeric material is difficult to produce in a consistent manner.

U.S. Pat. No. 5,230,987 requires a $T_g$ of 60° C.–125° C. for the copolymer used as the binder, but does not require a crosslinking agent in the binder.

In all of the above-described materials, the lack of crosslinking in the binder produces a soluble polymer in the monomer mixtures. The presence of a soluble polymer will result in significant swell when exposed to printing inks. Such systems are therefore not acceptable for use in printing applications where more than one type of ink may be used.

U.S. Pat. No. 5,238,783 describes a sea-and-island morphology, requiring the sea to be gelled by a gelling agent, and the islands to be composed of alkylene glycols or derivatives thereof. However, this material does not provide significant improvement in water processability and still requires a thermoplastic elastomeric block copolymer (such as SIS) as part of the binder.

PCT Publication No. 92/15628 uses a comb polymer material as the binder for the resin. This material is not sufficiently water dispersible to be suitable as a flexographic binder in a water processable printing plate.

PCT Publication No. 93/03423 uses a microgel, but requires a tertiary ammonium salt to be incorporated into the microgel, which must be reacted with an epoxy group to form the resin. This is an additional processing step complicating the manufacture of the binder and the formulation of the resin.

Each of the above-described systems, however, suffers from significant drawbacks that limit the broad usefulness of the resulting resins. What is still needed in the art, therefore, is a material useful for the production of flexographic resins which has improved physical and mechanical properties, is processable in an aqueous environment, and is easily manufactured.

BRIEF DESCRIPTION OF THE INVENTION

In accordance with the present invention, we have developed novel water-developable photopolymerizable compositions useful for the preparation of printing plates. Printing plates prepared employing invention compositions have excellent form stability (as well as non-tacky surfaces), thereby enabling such plates to be handled without the need for excessive care. In addition, printing plates prepared employing invention compositions have good clarity and flexibility, excellent washout properties, and retain such properties over extended periods of storage. Resin formulations according to the invention, when processed in an aqueous environment, produce a colloidally dispersed aqueous system. As used herein, the term "colloidally dispersed" indicates that the aqueous product produced by water processing of printing plates according to the invention is a latex, i.e., the material carried away by the aqueous media is uniformly dispersed therein as part of an emulsion, and not by dissolution thereof. This contrasts with prior art formulations where the base rubber material is removed by salvation thereof, with subsequent dissolution in the solvent, e.g., water.

Once photopolymerized, printing plates of the invention have excellent physical properties, enabling their use in many very demanding printing applications. Such applications require the photopolymerized resin to have excellent water resistance (so that exposure to water-based inks does not significantly alter resin properties). In addition, such applications require the photopolymerized resin to produce a sharp image, and to have high resilience (so that the physical contacting associated with the printing process does not significantly degrade resin properties). Photopolymerized resins of the invention maintain a good balance of resin properties such as tensile strength, percent elongation, hardness, resilience, and flexibility, without compromising the demands of printers for good reproduction of negative to a printed image. The base resin, before polymerization, must also maintain the key property of being easily developed in an entirely aqueous medium, even after months of storage before curing. At the same time, the cured photopolymer must be resistant to swell upon exposure to a wide variety of materials, including water.

DETAILED DESCRIPTION OF THE INVENTION

In accordance with the present invention, there are provided water-developable photosensitive resin compositions comprising:

(A) in the range of about 25 up to about 80 wt % of at least one copolymer consisting essentially of in the range of:
 (i) about 25 up to about 95 mol % of at least one elastomer forming monomer,
 (ii) about 0.5 up to about 30 mol % of at least one α,β-ethylenically unsaturated carboxylic acid, and
 (iii) about 0.1 up to about 50 mol % of at least one polyfunctional vinyl monomer;

(B) in the range of about 0.2 up to about 2 mol of at least one washout aid per mol of carboxyl groups in copolymer (A), (C) in the range of about 5 up to about 70 wt % of at least one ethylenically unsaturated monomer, (D) in the range of about 0.01 up to about 20 wt % of at least one photopolymerization initiator, (E) in the range of about 0 up to about 50 wt % of at least one polymer selected from:
 a linear thermoplastic, elastomeric block polymer having at least one unit of the general formula (A-B-A), (A-B)$_n$ or (A-B), wherein A is a non-elastomeric polymer block having a number average molecular weight of 2,000 to 100,000 and a glass transition temperature above about 25° C., and B is an elastomeric polymer block having a number average molecular weight of 25,000 to 1,000,000 and a glass transition temperature below about 10° C., or
 a linear polymer having a molecular weight of at least 1,000, which has at least 30 mol % of a conjugated diene unit, (F) in the range of 0 up to about 20 wt % of at least one plasticizer, and (G) in the range of 0 up to about 20 wt % of at least one emulsifier.

Copolymers (component (A) of the above-described compositions) contemplated for use in the practice of the present invention are prepared from a combination of several components, e.g., an elastomer forming monomer, an α,β-ethylenically unsaturated carboxylic acid, and a polyfunctional vinyl monomer, wherein said copolymer typically contains substantially no diene monomers. Typically, such compositions comprise in the range of about:

(i) about 25 up to about 95 mol % of at least one elastomer forming monomer,
(ii) about 0.5 up to about 30 mol % of at least one α,β-ethylenically unsaturated carboxylic acid, and
(iii) about 0.1 up to about 50 mol % of at least one polyfunctional vinyl monomer.

Preferred copolymer compositions employed in the practice of the present invention comprise in the range of:

(i) about 40 up to about 95 mol % of at least one elastomer forming monomer,
(ii) 2.5 up to 15 mol % of at least one α,β-ethylenically unsaturated carboxylic acid, and
(iii) 0.25 up to 10 mol % of at least one polyfunctional vinyl monomer.

Elastomer forming monomers contemplated for use in the practice of the present invention include acrylates, methacrylates, and the like. Exemplary compounds contemplated for use herein include ethyl (meth)acrylate, methyl (meth)acrylate, hydroxyethyl (meth)acrylate, dimethylaminopropyl (meth)acrylate, diethylaminopropyl (meth) acrylate, 2-ethylhexyl (meth)acrylate, butyl (meth)acrylate, lauryl (meth)acrylate, and the like, as well as mixtures of any two or more thereof.

α,β-ethylenically unsaturated carboxylic acids contemplated for use in the practice of the present invention include methacrylic acid, acrylic acid, itaconic acid, maleic acid, β-carboxyethyl acrylate (β-CEA), β-carboxyethyl methacrylate, and the like, as well as mixtures of any two or more thereof.

As used herein, the term "polyfunctional vinyl monomers" refers to compounds having more than one α,β-ethylenic site of unsaturation. Polyfunctional vinyl monomers contemplated for use in the practice of the present invention include ethyleneglycol di(meth)acrylate (i.e., ethyleneglycol diacrylate or ethyleneglycol dimethacrylate), divinyl benzene, 1,6-hexanediol di(meth)acrylate, 1,4-butanediol di(meth)acrylate, trimethylolpropane tri(meth) acrylate, erythritol tetra(meth)acrylate, and the like.

Invention compositions typically contain in the range of about 25–80 wt % of component A of the above-described composition. Preferred compositions of the invention contain in the range of about 35–70 wt % of component A of the above-described composition. Presently most preferred photopolymerizable compositions are those having in the range of about 40–60 wt % of component A, based on the weight of the total composition.

As readily recognized by those of skill in the art, component A can readily be prepared by emulsion polymerization techniques as are well known in the art. See, for example, the emulsion polymerization methodology described in the appended Examples, as well as U.S. Pat. Nos. 5,171,768 and 5,369,166, the contents of each of which are hereby incorporated by reference herein in their entirety.

Washout aids (component (B) of the above-described composition) contemplated for use in the practice of the present invention include basic nitrogen-containing compounds, alkali metal hydroxides, alkali metal carbonates, alkali metal salts of organic acids, and the like, as well as mixtures of any two or more thereof.

Basic nitrogen-containing compounds contemplated for use in the practice of the present invention include N,N-dialkylaminoalkyl (meth)acrylamides (e.g., N,N-dimethylaminopropyl methacrylamide (DMAPMA) or N,N-dimethylaminoethyl methacrylamide (DMAEMA)), N,N-dimethyldodecylamine (DDA), N,N-dimethylaminopropylamine (DAPA), N,N-dimethyltoluidine (DMT), triphenylamine (TPA), diethylamine (DEA), triethylamine (TEA), N,N-diethylaminoethanol (DEAE), N,N-dimethylaminopropanol (DMA), N,N-dimethylaminopropanamine (DMAP), alkyldimethylamine ADMA-C2 or alkyldimethylamine ADMA-C8 (available from Ethyl Corporation, Baton Rouge, La.), N,N-dimethylaminoethylmethacrylate (Ageflex FM2), N(N, N-dimethylamino)propyl-2-pyrrolidone (DMAPP), 1,3-bis (dimethylamino)propane (BDAP), 1,6-bis(dimethylamino) hexane (BDAH), and the like, as well as mixtures of any two or more thereof.

Alkali metal hydroxides contemplated for use in the practice of the present invention include sodium hydroxide, potassium hydroxide, lithium hydroxide, cesium hydroxide, and the like, as well as mixtures of any two or more thereof. Alkali metal carbonates contemplated for use in the practice of the present invention include sodium carbonate, potassium carbonate, lithium carbonate, cesium carbonate, and the like, as well as mixtures of any two or more thereof.

Alkali metal salts of organic acids contemplated for use in the practice of the present invention include sodium formate, sodium acetate, sodium propionate, sodium butyrate, sodium oxalate, sodium oleate, potassium formate, potassium acetate, potassium propionate, potassium butyrate, potassium oxalate, potassium oleate, lithium formate, lithium acetate, lithium propionate, lithium butyrate, lithium oxalate, lithium oleate, cesium formate, cesium acetate, cesium propionate, cesium butyrate, cesium oxalate, cesium oleate, and the like, as well as mixtures of any two or more thereof.

Invention compositions typically contain in the range of about 0.2–2 mols of component B (per mol of carboxyl in copolymer (A)). Preferred compositions of the invention contain in the range of about 0.5–1.5 mols of component B (per mol of carboxyl in copolymer (A)), with photopolymerizable compositions having in the range of about 0.8–1.2 mols of component B (per mol of carboxyl in copolymer (A)) being the presently most preferred.

Ethylenically unsaturated monomers (component (C) of the above-described composition) contemplated for use in the practice of the present invention include compounds having the core structure:

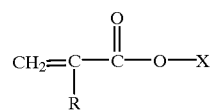

wherein R is H or methyl, and X is selected from:
(a) a straight chain or branched chain alkyl group having in the range of about 2 up to 15 carbon atoms, (b)

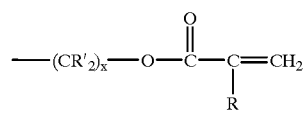

wherein each R' is independently selected from H or methyl, R is as defined above, selected independently of R of the core structure, and x is an integer falling in the range of about 2 up to 6,
(c)

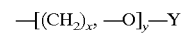

wherein x' is an integer falling in the range of about 1 up to 12, y is an integer falling in the range of about 1 up to 12, and Y is selected from:
hydrogen or alkyl having in the range of about 3 up to 15 carbon atoms such that two or more of the core species can be linked to one another, or

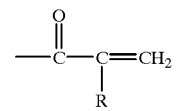

wherein R is as defined above and is selected independently of R of the core structure, and (d)

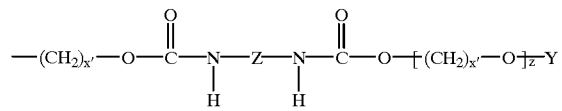

wherein x' and Y are as defined above, Z is an aliphatic, aromatic, aliphatic-substituted aromatic, or aromatic-substituted aliphatic linker having a molecular weight in the range of about 1,000–5,000, and z is an integer which falls in the range of about 0 up to 10.

Exemplary ethylenically unsaturated monomers (i.e., component C of the above-described composition) contemplated for use in the practice of the present invention include 1,4-butanediol di(meth)acrylate, 1,6-hexanediol di(meth) acrylate, lauryl (meth)acrylate, 1,3-diisopropenyl benzene, polyethylene glycol (400) di(meth)acrylate, highly ethoxylated trimethylol propane tri(meth)acrylate, propoxylated neopentyl glycol di(meth) acrylate, ethoxylated bisphenol A di(meth)acrylate, aliphatic urethane (meth)acrylate, aromatic urethane (meth)acrylate, ethyoxylated neopentylglycol di(meth)acrylate, polyethylene glycol (600) di(meth) acrylate, isobornyl (meth)acrylate, cyclohexyl (meth)

acrylate, diethylene glycol di(meth)acrylate, glycerol di(meth)acrylate, and the like, as well as mixtures of any two or more thereof. Presently preferred ethylenically unsaturated monomers contemplated for use in the practice of the present invention include 1,6-hexanediol dimethacrylate, lauryl methacrylate, polyethylene glycol (400) dimethacrylate, ethoxylated bisphenol A di(meth)acrylate, aliphatic urethane diacrylate, and the like, as well as mixtures of any two or more thereof.

Invention compositions typically contain in the range of about 5–70 wt % of component C of the above-described composition. Preferred compositions of the invention contain in the range of about 15–60 wt % of component C of the above-described composition, with photopolymerizable compositions having in the range of about 20–30 wt % of component C being the presently most preferred.

Those of skill in the art recognize that a wide range of photopolymerization initiators (component (D) of the above-described composition) can be used in the practice of the present invention. Suitable initiators for use in the compositions of the invention include hydrogen abstraction-type initiators (e.g., xanthone, thioxanthone, 2-chloroxanthone, benzil, benzophenone, 4,4'bis(N,N'-dimethylamino)benzophenone, polynuclear quinones (e.g., 9,10-anthraquinone, 9,10-phenanthrenequinone, 2-ethyl anthraquinone, 1,4-naphthoquinone), and the like), α-cleavage-type initiators, α-diketone compounds or monoketal derivatives thereof (e.g., diacetyl, benzil, benzyl dimethyl ketal, and the like), acyloins (e.g., benzoin, pivaloin, and the like), acyloin ethers (e.g., benzoin methyl ether, benzoin ethyl ether, benzoin propyl ether, and the like), acyl phosphine oxides, and the like, as well as mixtures of any two or more thereof. The initiator (D) is typically added in an amount of 0.01 to 10 parts by weight, preferably 0.05 to 5 parts by weight, per 100 parts by weight of the copolymer (A). Presently preferred initiators include hydrogen abstraction-type initiators (e.g., quinones such as 2-ethyl anthraquinone), a-cleavage-type initiators (e.g., ketals such as benzyl dimethyl ketal), and the like.

Optional linear polymers contemplated for inclusion in invention compositions (i.e., component (E) of the above-described compositions) include linear polymers which contain at least 30 mol % of a conjugated diene unit, with linear polymers having more than 50 mol % of a conjugated diene being preferred. Such polymers typically have a molecular weight of at least about 1,000, and can have molecular weights up to about 1,000,000 or more. Presently preferred linear polymers have molecular weights in the range of about 10,000 up to 100,000. Examples of linear polymers contemplated for use in the practice of the present invention include liquid isoprene (e.g., LIR 30 or LIR 50, available from Kuraray Co., Ltd), an acid-modified isoprene (e.g., LIR 403, available from Kuraray Co., Ltd), an acid halfester-modified isoprene (e.g., LIR 410, available from Kuraray Co., Ltd), copolymers of butadiene and acrylonitrile (e.g., Hycar, available from B. F. Goodrich, Cleveland, Ohio), polybutadienes (e.g., 1,2-polybutadiene (cis-, trans-, or mixtures thereof), 1,4-polybutadiene (cis-, trans-, or mixtures thereof)), maleic anhydride adducts of polybutadiene, which may then be modified via standard ring-opening techniques and subsequent (half) esterification or (half) amidation (e.g., Ricacryl HAC, Ricamine and Ricabond, available from Ricon Resins, Grand Junction, Colo.), acrylated 1,4-polybutadiene (e.g., INT-50, available from Japan Synthetic Rubber Co., Ltd, Tokyo, JP), and the like.

Additional linear polymers contemplated for inclusion in invention compositions (i.e., component (E) of the above-described compositions) include linear, thermoplastic, elastomeric block polymers that are either water-dispersible or non-dispersible in water, and have at least one unit from the general formula (A-B-A), (A-B)$_n$ or (A-B), where each A is a non-elastomeric polymer block having a number average molecular weight in the range of 2,000 to 100,000 and a glass transition temperature above about 25° C. Each A block is appended to an elastomeric block B, where each B has a number average molecular weight in the range of 25,000 to 1,000,000 and a glass transition temperature below about 10° C. The (A-B-A), (A-B)$_n$ or (A-B) units may describe the general formula of the block copolymer, or additional (A-B-A), (A-B)$_n$ or (A-B) units may be appended to it to form a repeating structure. It is possible to vary the nature of the A and B units, for example, by using two different terminal, non-elastomeric A blocks within the (A-B-A), (A-B)$_n$ or (A-B) structure, or by using two or more different elastomeric materials within the B block. Additionally, the repeating structure may be appended to another polymer. Examples of useful thermoplastic elastomer block copolymers contemplated for use in the practice of the present invention include materials manufactured by Shell Chemical Co., and sold under the trademark Kraton, materials manufactured by Enichem Elastomers Americas, Inc., and sold under the trademark Europrene, and the like.

When included in invention compositions, component E is typically present in the range of about 5–50 wt % of of the above-described composition. Preferred compositions of the invention contain in the range of about 10–35 wt % of component E, with photopolymerizable compositions having in the range of about 15–30 wt % of component E, based on the weight of the total composition, being the presently most preferred.

In accordance with a particular embodiment of the present invention, invention compositions may also contain a plasticizer (F) and/or emulsifier (G). The added presence of plasticizer acts to reduce the glass transition temperature of the polymeric components of the composition, thereby aiding in the processibility of the composition. Thus, the added presence of plasticizer acts to reduce composition hardness and modulus, thereby improving the compounding process-ability thereof. The added presence of emulsifier acts to facilitate washout of unreacted formulation from printing plates which have been exposed to electromagnetic radiation. It has surprisingly been found that the use of certain combinations of plasticizers and emulsifiers leads to enhanced benefits imparted by each of the components, above and beyond the processing improvements achieved with either of the additives used alone.

As used herein, the term "plasticizer" refers to a relatively low molecular weight material of very low softening point which associates strongly with at least one of the phases of the invention polymeric system, which comprises discrete domains of copolymer, discrete domains of elastomer, and a photopolymerizable interstitial phase that binds the domains of copolymer and elastomer together (and also contains photopolymerizable compound(s) and photoinitiator(s)).

Examples of plasticizers contemplated for use in the practice of the present invention include sulfonamides (e.g., N-butylbenzene sulfonamide (BBSA), N,N'-(2-methyl-1,5-pentanediyl)bis-benzenesulfonamide (HDP-S), N-ethyltoluene sulfonamide (e.g., Rit-cizer 8 (available from Rit Chemical, Pleasantville, N.Y.); paraffinic/naphthenic waxes or oils, such as Renoil 518 (available from Renkert Oil, Elverson, Pa.), Cyclolube 4053 (available from Witco, Golden Bear Division, Los Angeles, Calif.), Shellflex 371 (available from Shell Oil Co., Houston, Tex.), Indopol L-50 (an isobutylene/butene copolymer available from Amoco Chemical Co., Chicago, Ill.), and the like; mixed olefin waxes or oils such as the Wingtack series available from Goodyear, Akron, Ohio; polyterpene waxes or oils such as Piccolyte S25 (available from Hercules, Wilmington, Del.), Zonarez Alpha 25 (available from Arizona Chemical Co., Panama City, Fla.), and the like; alkylaryl resins such as Piccovar AP10 (available from Hercules); paraffinic waxes such as the Shellwax series (available from Shell Oil Co.) or Sun 5512 (available from Sun Chemical, Ft. Lee, N.J.); microcrystalline waxes such as Sun 5825 (available from Sun Chemical), coumarone-indene copolymers, such as R-17 (available from Neville, Pittsburgh, Pa.), poly(alphamethyl styrene), such as Piccotex (available from Hercules Chemical Co.), and the like, as well as mixtures of any two or more thereof.

When present, invention compositions typically contain in the range of about 0.5–20 wt % plasticizer, based on the total weight of the above-described composition. Preferred compositions of the invention contain in the range of about 2–15 wt % plasticizer, with photopolymerizable compositions having in the range of about 4–12 wt % plasticizer being the presently most preferred.

As used herein, the term "emulsifier" refers to any compound that reduces surface tension when dissolved in water or water solutions, or which reduces interfacial tension between two liquids, or between a liquid and a solid. Specifically, emulsifiers contemplated for use herein aid in compatibilizing the solid rubber domains of the photopolymerizable formulation with the aqueous developing solution. Examples of emulsifiers contemplated for use in the practice of the present invention include alkanolamides (e.g., linoleamide DEA, soyamide DEA, cocamide DEA, and the like); polyhydric alcohol esters (e.g., glycol stearate, propylene glycol laurate, propylene glycol stearate, dipropylene glycol salicylate, glycerol isostearate, and the like); fatty acids and esters thereof (e.g., stearic acid, sorbitol monostearate, glycerol isostearate, and the like); alkylene oxide condensates of fatty acids (or esters thereof), fatty alcohols (or esters thereof) or fatty amides, such as, for example, polyoxyalkene amide esters (e.g., Aimdex OE or Aethoxyl B (available from Chemtron, Paso Robles, Calif.)); ethoxylated alcohols (e.g., propoxylated lauryl alcohol); amidoamines (e.g., stearamidopropyl dimethylamine (available from Scher Chemicals, Clifton, N.J.)); and the like, as well as mixtures of any two or more thereof.

When present, invention compositions typically contain in the range of about 0.05–20 wt % emulsifier, based on the total weight of the above-described composition. Preferred compositions of the invention contain in the range of about 0.1–8 wt % emulsifier, with photopolymerizable compositions having in the range of about 0.5–5 wt % emulsifier being the presently most preferred.

Invention compositions may further contain additives to improve processability and handling characteristics. If desired, for example, to increase storage stability of the invention compositions, there may further be added a storage stabilizer such as hydroxyaromatic compounds (e.g., hydroquinone, p-methoxyphenol, p-t-butylcatechol, 2,6-di-t-butyl-p-cresol, pyrogallol, and the like); quinones (e.g., benzoquinone, p-toluquinone, p-xyloquinone, and the like); amines (e.g., N-phenyl-α-naphthylamine, and the like); imidazoles (e.g., methyl-benzimidazole); and the like, in an amount of 0.01 to 2 parts by weight per 100 parts by weight of copolymer (A).

Presently preferred compositions of the invention comprise, in addition to copolymer component (A) described above:

(B) in the range of about 0.5 up to 1.5 mols of at least one washout aid per mol of carboxyl in copolymer (A), wherein said washout aid is a basic nitrogen-containing compound, (C) in the range of about 15 up to about 60 wt % of at least one ethylenically unsaturated monomer, and (D) in the range of about 0.05 up to 5 parts of at least one photopolymerization initiator per 100 parts of said copolymer (A).

The above-described composition is particularly preferred because of the improved processability thereof (due to the reduced hardness and modulus thereof).

In accordance with another embodiment of the present invention, there are provided novel photosensitive resin compositions comprising:

(A) in the range of about 25 up to about 80 wt % of at least one copolymer comprising in the range of:
(i) about 25 up to about 95 mol % of at least one elastomer forming monomer,
(ii) about 0.5 up to about 30 mol % of at least one α,β-ethylenically unsaturated carboxylic acid, and
(iii) about 0.1 up to about 50 mol % of at least one polyfunctional vinyl monomer, provided, however, that said copolymer contains substantially no diene;

(B) in the range of about 0.2 up to about 2 mol of at least one washout aid per mol of carboxyl groups in copolymer (A), (C) in the range of about 5 up to about 70 wt % of at least one ethylenically unsaturated monomer, (D) in the range of about 0.01 up to about 20 wt % of at least one photopolymerization initiator, (E) in the range of about 0 up to about 50 wt % of at least one polymer selected from:
a linear thermoplastic, elastomeric block polymer having at least one unit of the general formula (A-B-A), (A-B)$_n$ or (A-B), wherein A is a non-elastomeric polymer block having a number average molecular weight of 2,000 to 100,000 and a glass transition temperature above about 25° C., and B is an elastomeric polymer block having a number average molecular weight of 25,000 to 1,000,000 and a glass transition temperature below about 10° C., or
a linear polymer having a molecular weight of at least 1,000, which has at least 30 mol % of a conjugated diene unit, (F) in the range of 0 up to about 20 wt % of at least one plasticizer, and (G) in the range of 0 up to about 20 wt % of at least one emulsifier.

Invention compositions, after photopolymerization and development thereof, have excellent water resistance. Water resistance can be measured in a variety of ways, such as, for example, by the percent thickness increase, which, after about 2 hours immersion in water at ambient conditions, is less than about 10%. Invention compositions possess excellent physical properties after photopolymerization and development thereof, e.g., the resin should have a tensile strength of >150 g/mm$^2$ (as measured by the Instron Series IX analyzer) and elongation of >50% (preferably greater than about 100%. The Shore A hardness should be appropriate for the contemplated printing application, e.g., <70 for typical newspaper applications, typical packaging applications, tag and label printing, and the like, or >85 for typical commercial applications (e.g., printing of cans, check printing, and the like).

Further, invention compositions require very little time to go from raw plate to "press ready" (i.e., total processing time for exposure, washout and drying). For example, a plate having a 15 mil thickness of invention resin thereon can be press ready (employing standard processing conditions) in less than about 15 minutes (preferably less than about 5 minutes). Those of skill in the art recognize that the processing time required for a given plate will vary based on the resin thickness, intensity of the irradiation employed to cure the plate, temperature of the washout media, and the like. Moreover, invention compositions produce plates which are not opaque and have sufficient flexibility that the imaged plate readily conforms to the negative.

One of the desirable characteristics of invention compositions is their developability with water of substantially neutral pH. Thus, there is no need to use pH modified (i.e., acidic or basic) media when developing invention compositions. Selective removal of the unreacted photo-sensitive composition layer is achieved by brushing or spraying the element with water heated to about 25–75° C. for about 5–30 minutes. Increased water temperature generally decreases the time required to remove the desired portions. It is important to use "soft" water, that is, water from which metallic cations such as $Ca^{+2}$, $Mg^{+2}$, and $Fe^{+2}$ have been removed, during the washing process. The presence of these inorganic cations impedes the dispersion of unpolymerized areas. Commonly available water softening systems (such as ion exchange systems) are suitable for pre-treating the water used to remove the unreacted photosensitive composition. The processed plate is dried in an oven at about 50–80° C. for about 2–15 minutes. The processed plate is then post-exposed with ultraviolet (UV) light for about 15 seconds to 10 minutes to further toughen the plate. These last two steps are utilized in the processing of other types of photosensitive printing plates, but the required times are much longer for those other types of plate. Generally, no further surface treatments (such as oxidation), which are necessary for some other photosensitive printing plates, are needed before the plate can be used.

Photoset and developed compositions prepared according to the present invention can be used for printing immediately after drying, and hence, invention compositions can substantially improve the conventional complicated process and the time for producing rubber relief plates for flexographic printing.

A variety of flexographic inks (e.g., oil-based, alcohol-based, etc) can be used in flexographic printing using photopolymer relief plates made from invention composition. Aqueous flexographic inks can also be used with invention compositions (consistent with the gradual shift in the printing field from solvent type flexographic inks to aqueous type flexographic inks). This shift is driven, in large part, by the desire to reduce the contribution to air and water pollution made by the printing industry. Furthermore, invention compositions are also compatible with UV curable inks.

Invention compositions not only provide resin relief plates for flexographic printing, but can also be widely utilized as a photosensitive material in various applications such as the production of relief plates for newspaper printing and ordinary package printing, name plates, printed circuit boards, displays and photoadhesives. In addition, photosensitive compositions of the invention can be used as photopolymerizable coatings.

In accordance with another embodiment of the present invention, there are provided water-developable photosensitive resin plates comprising a support having deposited thereon a layer of the above-described photosensitive resin compositions. Invention resin plates can be characterized as having excellent form stability (as indicated, for example, by undergoing substantially no change in thickness uniformity when subjected to temperature in the range of 25° C. and 40° C.), a high degree of flexibility, excellent washout properties (i.e., unexposed composition can be readily removed from the plate with a relatively mild water wash, not requiring the presence of alkali or extreme temperatures), a non-tacky surface, and good clarity (i.e., providing a substantially transparent photopolymer layer which readily accepts incident radiation), as well as being capable of forming a colloidally dispersed aqueous system upon contact with water.

Supports contemplated for use in the practice of the present invention can be prepared from a variety of materials, e.g., metal, plastic, paper, wood, glass, and the like. Exemplary support materials include steel, aluminum and plastic (e.g., polyethylene terephthalate). As readily recognized by those of skill in the art, the support used for application of the printed surface thereto can have a variety of shapes, e.g., flat, cylindrical (as used with a flexo sleeve—a rubber relief plate wrapped around a removable sleeve, thereby providing a continuous printing surface), and the like.

In accordance with yet another embodiment of the present invention, there are provided relief printing plates comprising a support having deposited thereon a photopolymerized layer of the above-described photosensitive resin compositions. Invention resin plates are substantially resistant to swell (i.e., have a thickness increase, upon immersion in water for 2 hours at ambient conditions, of less than about 10%), have excellent physical properties, e.g., a soft, yet tough and resilient surface (as determined, for example, by Shore A test, tensile strength, elongation, and the like).

In accordance with still another embodiment of the present invention, there are provided methods for preparing water-developable photosensitive resin plates suitable for the manufacture of relief printing plates having excellent form stability, a high degree of flexibility, excellent washout properties, a non-tacky surface, and good clarity. Invention method comprises depositing onto a suitable support a substantially homogenous, solvent-free combination of components (A), (B), (C), (D) and optionally (E), (F) and (G), as described above.

"Depositing" of the above-described compositions onto support can be carried out in a variety of ways, e.g., by extrusion, roll coating, heat processing, solvent casting, and the like. These techniques can be readily carried out by those of skill in the art.

In accordance with a further embodiment of the present invention, there are provided methods for preparing relief printing plates characterized as being substantially resistant to swell, and having a soft, yet tough and resilient surface. Invention methods comprise:

exposing a photosensitive resin plate according to the invention (as described above), optionally through a negative film having an image thereon, to electromagnetic radiation of sufficient energy to promote the polymerization of said resin, and washing said plate with a sufficient quantity of water to remove the photosensitive resin composition from the non-exposed portions of said plate.

Exposure contemplated by the above-described method can be accomplished employing either coherent or non-coherent radiation, and can be provided by a variety of sources, e.g., an ion gas laser (e.g., an argon ion laser, a krypton laser, a helium:cadmium laser, and the like), a solid state laser (e.g., a frequency-doubled Nd:YAG laser), a semiconductor diode laser, an arc lamp (e.g., a medium pressure mercury lamp, a Xenon lamp, a carbon arc lamp, and the like), and the like). Exposure sources capable of providing ultraviolet and visible wavelength radiation (with wavelengths typically falling in the range of 300–700 nm) can also be used for the practice of the present invention. Preferred wavelengths are those which correspond to the spectral sensitivity of the initiator being employed.

The invention will now be described in greater detail by reference to the following non-limiting examples.

The resin compositions described in Examples 1–5 which follow were placed between two sheets of polyester terephthalate (DuPont Mylar™) coated with a silicone release material and pressed onto a metal plate to a thickness of 0.035 inches. The resulting material was tested for washrate. Physical properties of the resin were tested using an Instron. The resin composition was placed between mylar sheets and pressed to 0.015 inches thickness and exposed to UV light for 5 minutes/side.

EXAMPLE 1

Invention Composition I

A crosslinked particle was prepared using emulsion polymerization technology familiar to those skilled in the art employing:

92 parts ethyl acrylate, 6 parts methacrylic acid, 2 parts hexanediol diacrylate, 0.4% ammonium persulfate, and 1.0% Rhodafac RE610 emulsifier (available from Rhone-Poulenc), neutralized with 0.5% sodium hydroxide.

Thus, an emulsion was formed from the emulsifier, 356 g of ethyl acrylate, 24 g of methacrylic acid, 8 g of hexanediol diacrylate and 400 g of water. A solution of ammonium persulfate initiator (1.6 g in 100 ml of water) was also prepared. A four neck, 2000 ml round bottom flask, equipped with a mechanical stirrer, an addition funnel, a nitrogen inlet, a temperature probe and a bubbler, was then prepared for reaction as follows. The flask was placed in a heated water bath maintained at a temperature of 60° C., then 200 ml of water was added thereto, and the flask purged with nitrogen for about 30 minutes. 20 ml of the initiator solution was then added to the flask, followed about 2 minutes later by addition of about 20 ml of the above-described emulsion. The remaining emulsion and initiator solution were then added over about 90 minutes. The reaction was allowed to continue for about 1 hour after addition of reactants was complete, then the flask was removed from the bath, nitrogen purge discontinued, and the flask allowed to cool to room temperature. The emulsion was then poured into a blender and a sufficient quantity of solid calcium chloride was added to promote coagulation of the polymer (typically in the range of about 60 g/2 L). The solid polymer was then washed 2–6 times in the blender with a sufficient quantity of distilled water per wash to enable ready handling thereof (typically in the range of about 500–1500 ml of distilled water per wash). The resulting polymer was then dried in a vacuum oven at about 60° C. for about 12 hours.

58.3 parts by weight of the resulting base polymer was milled on a two roll mill at 60° C. with a solution containing:

6.0 parts N,N-dimethylaminopropylmethacrylamide (commercially available from Rohm Tech), 18.0 parts 4-hydroxybutylacrylate, 2.8 parts hexanedioldimethacrylate, 0.8 parts ethoxylated phenol (available from Daichi Kogyu), 3.6 parts polyethylene glycol 400 diacrylate (available from Sartomer), 4.2 parts highly ethoxylated trimethylolpropane triacrylate (available from Henkel as photomer 4158), 3.8 parts polyethylene glycol 600 dimethacrylate (available from Sartomer), 2.0 parts Irgacure 651 (benzildimethyl ketone), and 0.5 parts 2,6-di-t-butyl-p-cresol.

The resulting material was tested for physical properties and washrate, and the properties are summarized in the Table.

EXAMPLE 2

Invention Composition II

A crosslinked particle was prepared using emulsion polymerization technology familiar to those skilled in the art employing:

89 parts ethyl acrylate, 9 parts methacrylic acid, 2 parts hexanediol diacrylate, 0.4% ammonium persulfate, and 1.0% Rhodafac RE610 emulsifier (available from Rhone-Poulenc), neutralized with 0.5% sodium hydroxide.

The above-described materials were subjected to emulsion polymerization following the protocol set forth in Example 1.

57.8 parts by weight of the resulting polymer was milled on a two roll mill at 60° C. with a solution containing:

10.3 parts N,N-dimethylaminopropylmethacrylamide, 18.1 parts 4-hydroxybutylacrylate, 2.8 parts hexanediol dimethacrylate, 0.8 parts ethoxylated phenol, 2.8 parts polyethylene glycol 400 diacrylate, 2.8 parts highly ethoxylated trimethylolpropane triacrylate, 2.8 parts polyethylene glycol 600 dimethacrylate, 2.0 parts Irgacure 651, and 0.5 parts 2,6-di-t-butyl-p-cresol.

The resulting material was tested for physical properties and washrate, and the properties are summarized in the Table.

EXAMPLE 3

Invention Composition III

A crosslinked particle was prepared using emulsion polymerization technology familiar to those skilled in the art employing:

92 parts butyl acrylate, 7 parts methacrylic acid, and 1 parts hexanediol diacrylate, 0.4% ammonium persulfate, and 1.0% Rhodafac RE610 emulsifier (available from Rhone-Poulenc), neutralized with 0.5% sodium hydroxide.

The above-described materials were subjected to emulsion polymerization following the protocol set forth in Example 1.

58.3 parts by weight of the resulting polymer was milled on a two roll mill at 60° C. with a solution containing:

6.0 parts N,N-dimethylaminopropylmethacrylamide, 18.0 parts 4-hydroxybutylacrylate, 2.8 parts hexanediol dimethacrylate,
0.8 parts ethoxylated phenol,
3.6 parts polyethylene glycol 400 diacrylate,
4.2 parts highly ethoxylated trimethylolpropane triacrylate,
3.8 parts polyethylene glycol 600 dimethacrylate,
2.0 parts Irgacure 651 (benzildimethyl ketone), and
0.5 parts 2,6-di-t-butyl-p-cresol.

The resulting material was tested for physical properties and washrate, and the properties are summarized in the Table.

EXAMPLE 4

Invention Composition IV

A crosslinked particle was prepared using emulsion polymerization technology familiar to those skilled in the art employing:

93 parts butyl acrylate,
5 parts methacrylic acid, and
2 parts hexanediol diacrylate,
0.25% potassium persulfate, and
1.0% sodium dodecyl sulfate emulsifier.

The above-described materials were subjected to emulsion polymerization following the protocol set forth in Example 1.

58.3 parts by weight of the resulting polymer was milled on a two roll mill at 60° C. with a solution containing:

6.0 parts N,N-dimethylaminopropyl methacrylamide,
18.0 parts 4-hydroxybutylacrylate,
2.8 parts hexanediol dimethacrylate,
0.8 parts ethoxylated phenol,
3.6 parts polyethylene glycol 400 diacrylate,
4.2 parts highly ethoxylated trimethylolpropane triacrylate,
3.8 parts polyethylene glycol 600 dimethacrylate,
2.0 parts Irgacure 651, and
0.5 parts 2,6-di-t-butyl-p-cresol.

The resulting material was tested for physical properties and washrate, and the properties are summarized in the Table.

EXAMPLE 5

Invention Composition V

A crosslinked particle was prepared using emulsion polymerization technology familiar to those skilled in the art employing:

88.6 parts ethyl acrylate,
9 parts methacrylic acid, and
2.4 parts tetraethyleneglycoldiacrylate,
0.25% potassium persulfate, and
1.0% sodium dodecyl sulfate emulsifier.

The above-described materials were subjected to emulsion polymerization following the protocol set forth in Example 1.

57.8 parts by weight of the resulting polymer was milled on a two roll mill at 60° C. with a solution containing:

10.3 parts N,N-dimethylaminopropyl methacrylamide,
18.1 parts 4-hydroxybutylacrylate,
2.8 parts hexanediol dimethacrylate,
0.8 parts ethoxylated phenol.
2.8 parts polyethylene glycol 400 diacrylate,
2.8 parts highly ethoxylated trimethylolpropane triacrylate,
2.8 parts polyethylene glycol 600 dimethacrylate,
2.0 parts Irgacure 651, and
0.5 parts 2,6-di-t-butyl-p-cresol.

The resulting material was tested for physical properties and washrate, and the properties are summarized in the Table.

COMPARATIVE EXAMPLE A

A crosslinked particle was prepared using the reaction components and emulsion polymerization technology described in U.S. Pat. No. 4,275,142.

58.8 parts by weight of the resulting polymer was milled on a two roll mill at 60° C. with a solution containing:

6.0 parts N,N-dimethylaminopropyl methacrylamide,
18.2 parts 4-hydroxybutylacrylate,
2.8 parts hexanediol dimethacrylate,
0.9 parts ethoxylated phenol,
3.7 parts polyethylene glycol 400 diacrylate,
7.1 parts highly ethoxylated glycerol triacrylate,
2.0 parts Irgacure 651 (benzildimethyl ketone), and
0.5 parts 2,6-di-t-butyl-p-cresol.

The resulting material was tested for physical properties and washrate, and the properties are summarized in the Table.

COMPARATIVE EXAMPLE B

A polymer was prepared using the reaction components and polymerization technology described in U.S. Pat. No. 5,460,920.

59.5 parts by weight of the resulting polymer was milled on a two roll mill at 70° C. with a solution containing:

11.5 parts N-1-butyl-ethanolamine,
8.4 parts 4-hydroxybutylacrylate,
7.4 parts N,N-dimethylaminopropyl methacrylamide,
3.0 parts hexanediol dimethacrylate,
3.8 parts glycidyl methacrylate,
4.0 parts Loxiol VPG1304 (available from BASF),
1.9 parts Irgacure 651 (benzildimethyl ketone), and
0.5 parts 2,6-di-t-butyl-p-cresol.

The resulting material was tested for physical properties and washrate, and the properties are summarized in the Table.

TABLE

| Composition | Washrate inches/minute | Tensile Strength $g/mm^2$ | Elongation % | Breakoff Energy kg-mm | Modulus to 30% $g/mm^2$ | Shore A hardness |
|---|---|---|---|---|---|---|
| Inv. Comp I (example 1) | 27 | 445 | 126 | 70 | 684 | 61 |
| Inv. Comp II (Example 2) | 27 | 953 | 150 | 167 | 1110 | 68 |

TABLE-continued

| Composition | Washrate inches/minute | Tensile Strength g/mm² | Elongation % | Breakoff Energy kg-mm | Modulus to 30% g/mm² | Shore A hardness |
|---|---|---|---|---|---|---|
| Inv. Comp III (Example 3) | 26 | 323 | 135 | 72 | 396 | 66 |
| Inv. Comp. IV (Example 4) | 37 | 178 | 63 | 22 | 312 | 63 |
| Inv. Comp V (Example 5) | 25 | 534 | 145 | 86 | 752 | 89 |
| Comp. Comp A (Example 6) | 18 | 462 | 62 | 38 | 722 | 72 |
| Comp. Comp. B (Example 7) | 8 | 128 | 243 | 49 | 90 | 52 |

The data in the preceding table demonstrate that invention printing plates have superior performance properties relative to prior art photopolymer printing plates.

EXAMPLE 6

Test Methods

A. Hardness Test Method

Place 150 grams of raw resin between two sheets of silicone-coated mylar and position the resulting sandwich in the center of the molding press. Apply 150 tons of force @60° C. for 5 seconds. Cut out six to eight 4 inch×4 inch squares of the resulting pressed, raw resin and stack. The weight of the stack should be 75 to 80 grams.

Place the resin stack in the center of a square steel frame mold with internal dimensions of 6 inch×6 inch×3 mm thick. Place the resin stack and steel frame between 2 sheets of silicone-coated mylar and position the resulting assemblage in the center of the molding press. Apply 100 tons of force @70° C. for 20 seconds. Repeat until there is enough bubble-free resin to cut out two 5 cm×5 cm squares.

Expose the molded resin for 5 minutes to a medium pressure mercury vapor lamp, mounted in a Newsprinter II exposure unit (NAPP SYSTEMS INC., San Marcos, Calif.) while still in the mold. Turn the square over and expose the other side for an additional 5 minutes.

Trim approximately ½ inch of cured resin from each side of the 6 inch×6 inch square. Cut out and stack two 5 cm×5 cm squares with a thickness tolerance of ±50 microns. Place the resin stack in a constant temperature room at a temperature of 25° C. for 2 hours before making any measurements.

Adjust the Shore automatic operating stand so that the bottom of the durometer (not the indenter) is approximately ¼ inch from the specimen. Use this procedure for calibrating the durometer with standards and for making specimen measurements. Turn on the automatic operating stand and make five measurements, ½ inch from the edge at each corner and in the center. Turn the stack over and make five more measurements.

The average and standard deviation of the ten measurements is then reported.

B. Flexo Method

For testing flexo resin, a 100 newton (100N) load cell is used on an Instron Strain Gauge Extensometer Model 4202 (Instron Corporation, Canton, Mass.). Instrument parameters employed include:

Sample width 10 mm,
Gauge length 50 mm,
Grip distance 70 mm, and
Cross head speed 150 mm/min.

A dumbbell sample (~0.7 mm thick, fully cured resin) is inserted between clamps (positioned about 70 mm apart) and tightened well. It is desirable for the sample to be as straight as possible, with as little slack as possible.

Enter the mean thickness for the sample, and start the instrument. Repeat for each sample (about 8–10 samples should be tested to obtain good statistical results). The instrument's computer will calculate mean values for tensile strength, % elongation, Young's modulus to 30%, and Break-off energy (a measure of toughness).

While the invention has been described in detail with reference to certain preferred embodiments thereof, it will be understood that modifications and variations are within the spirit and scope of that which is described and claimed.

That which is claimed is:

1. A water-developable photosensitive resin composition comprising:
   (A) in the range of about 25 up to about 80 wt % of at least one copolymer comprising in the range of:
      (i) about 25 up to about 95 mol % of at least one elastomer forming monomer,
      (ii) about 0.5 up to about 30 mol % of at least one α,β-ethylenically unsaturated carboxylic acid, and
      (iii) about 0.1 up to about 50 mol % of at least one polyfunctional vinyl monomer, provided, however, that said copolymer contains substantially no diene;
   (B) in the range of about 0.2 up to about 2 mol of at least one washout aid per mol of carboxyl groups in copolymer (A),
   (C) in the range of about 5 up to about 70 wt % of at least one ethylenically unsaturated monomer,
   (D) in the range of about 0.01 up to about 20 wt % of at least one photopolymerization initiator,
   (E) in the range of about 0 up to about 50 wt % of at least one polymer selected from the group consisting of:
      a linear thermoplastic, elastomeric block polymer having at least one unit of the general formula (A-B-A), (A-B)$_n$, or (A-B), wherein A is a non-elastomeric polymer block having a number average molecular weight of 2,000 to 100,000 and a glass transition temperature above about 25° C., and B is an elastomeric polymer block having a number average molecular weight of 25,000 to 1,000,000 and a glass transition temperature below about 10° C., and
      a linear polymer having a molecular weight of at least 1,000, which has at least 30 mol % of a conjugated diene unit,
   (F) in the range of 0 up to about 20 wt % of at least one plasticizer, and
   (G) in the range of 0 up to about 20 wt % of at least one emulsifier.

2. A composition according to claim 1 wherein said copolymer comprises in the range of:

(i) about 40 up to about 95 mol % of at least one elastomer forming monomer, (ii) about 2.5 up to about 15 mol % of at least one α,β-ethylenically unsaturated carboxylic acid, and (iii) 0.25 up to 10 mol % of at least one polyfunctional vinyl monomer.

3. A composition according to claim 1 wherein said elastomer forming monomer is an acrylate or a methacrylate, said α,β-ethylenically unsaturated carboxylic acid is (meth)acrylic acid, and said polyfunctional vinyl monomer is ethyleneglycol di(meth)acrylate, divinyl benzene, or 1,6-hexanediol di(meth)acrylate.

4. A composition according to claim 1 wherein said ethylenically unsaturated monomer (C) has structure (I) as follows:

(I)

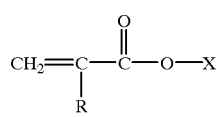

wherein R is H or methyl, and X is:
(a) a straight chain or branched chain alkyl group having in the range of about 2 up to 15 carbon atoms, (b)

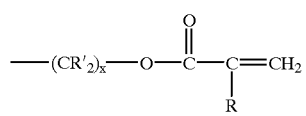

wherein each R' is independently H or methyl, R is as defined above, selected independently of R of structure I, and x is an integer falling in the range of about 2 up to 6, (c)

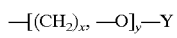

wherein x' is an integer falling in the range of about 1 up to 12, y is an integer falling in the range of about 1 up to 12, and Y is:
hydrogen or alkyl having in the range of about 3 up to 15 carbon atoms such that two or more species of structure I can be linked to one another, or

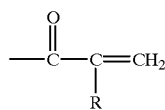

wherein R is as defined above and is selected independently of R of structure I, or (d)

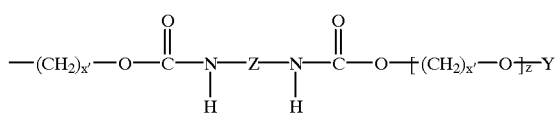

wherein x' and Y are as defined above, Z is an aliphatic, aromatic, aliphatic-substituted aromatic, or aromatic-substituted aliphatic linker having a molecular weight in the range of about 1,000–5,000, and z is an integer which falls in the range of about 0 up to 10.

5. A composition according to claim 1 wherein said ethylenically unsaturated monomer (C) is 1,4-butanediol di(meth)acrylate, 1,6-hexanediol di(meth)acrylate, lauryl (meth)acrylate, 1,3-diisopropenyl benzene, polyethylene glycol (400) di(meth)acrylate, highly ethoxylated trimethylol propane tri(meth)acrylate, propoxylated neopentyl glycol di(meth)acrylate, ethoxylated bisphenol A di(meth)acrylate, aliphatic urethane (meth)acrylate, aromatic urethane (meth)acrylate, or mixtures of any two or more thereof.

6. A composition according to claim 1 comprising in the range of about 15 up to about 60 wt % of said ethylenically unsaturated monomer (C).

7. A composition according to claim 1 wherein said washout aid is:
a basic nitrogen-containing compound,
alkali metal hydroxides,
alkali metal carbonates,
alkali metal salts of organic acids,
or mixtures of any two or more thereof.

8. A composition according to claim 1 wherein said washout aid is a basic nitrogen-containing compound selected from the group consisting of N,N-dimethylaminopropyl methacrylamide, N,N-dimethylaminoethyl methacrylamide, N,N,-dimethyldodecylamine, N,N-dimethylaminopropylamine, N,N-dimethyltoluidine, triphenylamine, diethylamine, triethylamine, N,N-diethylaminoethanol, N,N-dimethylaminopropanol, N,N-dimethylamino-propanamine, alkyldimethylamine ADMA-C2, alkyldimethylamine ADMA-C8, N,N-dimethylamino-ethylmethacrylate, N(N,N-dimethylamino)propyl-2-pyrrolidone, 1,3-bis(dimethylamino)-propane, 1,6-bis(dimethylamino) hexane, and mixtures of any two or more thereof.

9. A water-developable photosensitive resin plate comprising a support having deposited thereon a layer of photosensitive resin composition according to claim 1, wherein said plate is characterized as having excellent form stability, a high degree of flexibility, excellent washout properties, a non-tacky surface, and good clarity, and wherein the resin material removed during washing of the resin is capable of forming a colloidally dispersed aqueous system upon contact with water.

10. A plate according to claim 9 wherein said support is selected from metal or plastic material.

11. A plate according to claim 9 wherein the support is flat or cylindrical.

12. A method for preparing a relief printing late characterized as being substantially resistant to swell, having a soft, yet tough and resilient surface, good ink transfer properties, and providing a sharp image, said method comprising:
exposing a photosensitive resin plate according to claim 9, optionally through a negative film having an image thereon, to electromagnetic radiation of sufficient energy to promote the polymerization of said resin, and
washing said plate with a sufficient quantity of water to remove the photosensitive resin composition from the non-exposed portions of said plate.

13. A method for preparing a water-developable photosensitive resin plate suitable for the manufacture of a relief printing plate characterized as having excellent form stability, a high degree of flexibility, excellent washout properties, a non-tacky surface, and good clarity, said method comprising depositing onto a suitable support a substantially homogenous, solvent-free combination of a water-developable photosensitive resin composition comprising:

(A) in the range of about 25 up to about 80 wt % of at least one copolymer comprising in the range of:
  (i) about 25 up to about 95 mol % of at least one elastomer forming monomer,
  (ii) about 0.5 up to about 30 mol % of at least one α,β-ethylenically unsaturated carboxylic acid, and
  (iii) about 0.1 up to about 50 mol % of at least one polyfunctional vinyl monomer, provided, however, that said copolymer contains substantially no diene;

(B) in the range of about 0.2 up to about 2 mol of at least one washout aid per mol of carboxyl groups in copolymer (A), (C) in the range of about 5 up to about 70 wt % of at least one ethylenically unsaturated monomer, (D) in the range of about 0.01 up to about 20 wt % of at least one photopolymerization initiator, (E) in the range of about 0 up to about 50 wt % of at least one polymer selected from:

a linear thermoplastic, elastomeric block polymer having at least one unit of the general formula (A-B-A), (A-B)$_n$ or (A-B), wherein A is a non-elastomeric polymer block having a number average molecular weight of 2,000 to 100,000 and a glass transition temperature above about 25° C., and B is an elastomeric polymer block having a number average molecular weight of 25,000 to 1,000,000 and a glass transition temperature below about 10° C., or a linear polymer having a molecular weight of at least 1,000, which has at least 30 mol % of a conjugated diene unit, (F) in the range of 0 up to about 20 wt % of at least one plasticizer, and (G) in the range of 0 up to about 20 wt % of at least one emulsifier.

14. A method according to claim 13 wherein said depositing is carried out by extrusion, roll coating, or heat processing.

* * * * *